(12) United States Patent
Maerz et al.

(10) Patent No.: US 10,158,359 B2
(45) Date of Patent: *Dec. 18, 2018

(54) INTEGRATED MAGNETIC FIELD SENSOR-CONTROLLED SWITCH DEVICES

(71) Applicant: Infineon Technologies AG, Neubiberg (DE)

(72) Inventors: Sebastian Maerz, Berg (DE); Franz Jost, Stuttgart (DE); Udo Ausserlechner, Villach (AT); Jean-Marie Le Gall, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/955,552

(22) Filed: Dec. 1, 2015

(65) Prior Publication Data

US 2016/0126951 A1 May 5, 2016

Related U.S. Application Data

(63) Continuation-in-part of application No. 13/366,917, filed on Feb. 6, 2012, now Pat. No. 9,203,394, which
(Continued)

(51) Int. Cl.
| | | |
|---|---|---|
| *H03K 17/95* | (2006.01) | |
| *H02P 31/00* | (2006.01) | |
| *H01L 43/06* | (2006.01) | |
| *H01L 43/04* | (2006.01) | |
| *H05B 33/08* | (2006.01) | |

(Continued)

(52) U.S. Cl.
CPC ....... *H03K 17/9517* (2013.01); *H01L 25/165* (2013.01); *H01L 43/04* (2013.01); *H01L 43/065* (2013.01); *H02P 31/00* (2013.01); *H03K 17/0822* (2013.01); *H03K 17/90* (2013.01); *H05B 33/0851* (2013.01); *H05B 33/0866* (2013.01); *H01L 2924/0002* (2013.01); *H03K 2017/0806* (2013.01); *H03K 2217/0063* (2013.01); *Y10T 29/49117* (2015.01)

(58) Field of Classification Search
CPC .... G01R 33/0047; G01R 33/06; G01R 33/07; H03K 17/9517
USPC .......................... 324/247, 251, 252; 384/448
See application file for complete search history.

(56) References Cited

U.S. PATENT DOCUMENTS

| | | | |
|---|---|---|---|
| 4,873,474 A | | 10/1989 | Johnson |
| 5,247,803 A | * | 9/1993 | Adams .................... F25B 45/00 62/149 |

(Continued)

OTHER PUBLICATIONS

Infineon, Smart High-Side Power Switch BTS4140N, Smart High-Side Power Switch One Channel: 1 ×1Ω, dated May 29, 2007, 14 pages.
(Continued)

*Primary Examiner* — Bo Fan
(74) *Attorney, Agent, or Firm* — Schiff Hardin LLP

(57) ABSTRACT

Embodiments relate to integrated magnetic field sensor-controlled switch devices, such as transistors, current sources, and power switches, among others. In an embodiment, a magnetic switch and a load switch are integrated in a single integrated circuit device. In embodiments, the magnetic switch is configured to sense a dynamic change in magnetic field caused by movement of a magnet in at least one of a linear, three-dimensional, and rotational direction.

12 Claims, 7 Drawing Sheets

Related U.S. Application Data is a continuation-in-part of application No. 13/267,308, filed on Oct. 6, 2011, now Pat. No. 9,294,087.

(51) Int. Cl.
- H01L 25/16 (2006.01)
- H03K 17/082 (2006.01)
- H03K 17/90 (2006.01)
- H03K 17/08 (2006.01)

(56) References Cited

U.S. PATENT DOCUMENTS

| | | | | |
|---|---|---|---|---|
| 5,572,876 | A * | 11/1996 | Um | F24F 11/30 62/89 |
| 6,738,246 | B1 | 5/2004 | Strumpler | |
| 2004/0196605 | A1 * | 10/2004 | Dinn | G08C 17/04 361/91.1 |
| 2005/0212523 | A1 * | 9/2005 | Chang | G01R 31/2829 324/511 |
| 2008/0125288 | A1 | 5/2008 | Case | |
| 2009/0317027 | A1 * | 12/2009 | Burt | F16H 25/2427 384/448 |
| 2011/0234218 | A1 * | 9/2011 | Lagouge | G01R 33/072 324/247 |
| 2011/0254611 | A1 | 10/2011 | Volkmann | |
| 2012/0182658 | A1 | 7/2012 | Motz | |

OTHER PUBLICATIONS

Infineon, Hall Sensors for Automotive, Industrial, and Consumer Applications, as available on Oct. 6, 2011 at www.infineon.com, 5 pages.

Magnasphere Corp., Technology Overview: Magnasphere, available at www.magnasphere.com, reivsed Feb. 18, 2010, 2 pages.

* cited by examiner

INTEGRATED MAGNETIC FIELD SENSOR-CONTROLLED SWITCH DEVICES

RELATED APPLICATIONS

This application is a continuation-in-part of application Ser. No. 13/366,917 filed Feb. 6, 2011, which is a continuation-in-part of application Ser. No. 13/267,308 filed Oct. 6, 2011, which are hereby fully incorporated herein by reference.

TECHNICAL FIELD

The disclosure relates generally to switch devices and more particularly to magnetic field sensor-controlled switch devices.

BACKGROUND

Semiconductor Hall sensors are currently used for logic signaling but typically are able to switch only a limited load current. Therefore, two separate devices are currently used: a Hall sensor and a load switching integrated circuit (IC). Usually, in operation, a Hall sensor signal indicative of a switching state is received by a microcontroller which in turn activates the load switching IC. The Hall sensor and the load switching IC are typically soldered on a printed circuit board (PCB). Such a configuration uses more board and package space than is desired and is more complex in terms in of periphery space and wiring, each of which in turn leads to a higher cost.

Therefore, there is a need for improved power switches that take advantage of the robustness and reliability of magnetic field sensors like Hall sensors.

Figure 1A:
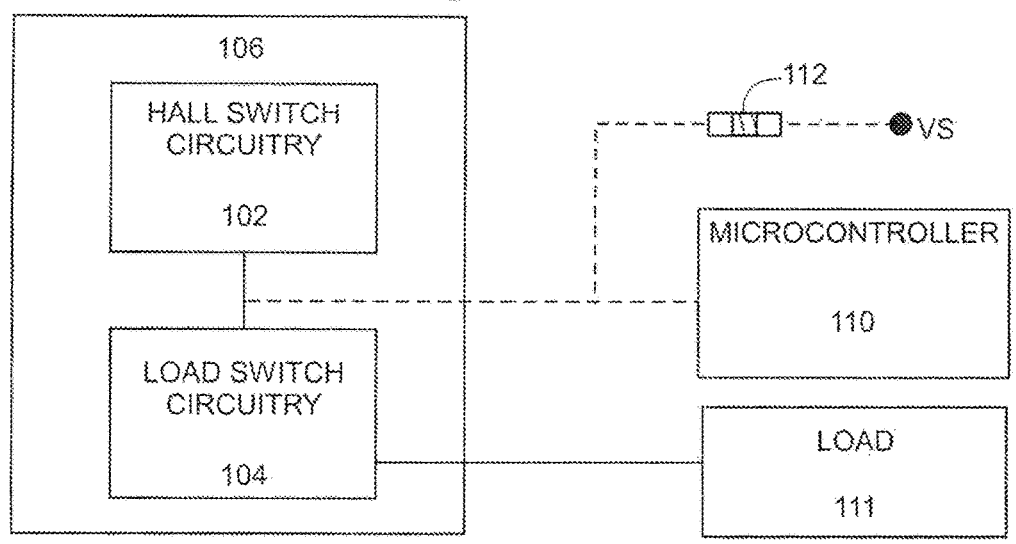
FIG. 1A is a block diagram of an integrated magnetic sensor switch device according to an embodiment.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure as defined by the appended claims.

DETAILED DESCRIPTION

Embodiments relate to integrated magnetic field sensor-controlled switch devices, such as transistors, current sources, and power switches, among others. In an embodiment, a magnetic switch and a load switch are integrated in a single integrated vertical circuit device. In embodiments, the device can also include integrated load protection and load diagnostics. Embodiments can provide load switching and optional simultaneous logic signaling, for example to update a microcontroller or electronic control unit (ECU), while reducing space and complexity and thereby cost.

Figure 1B:
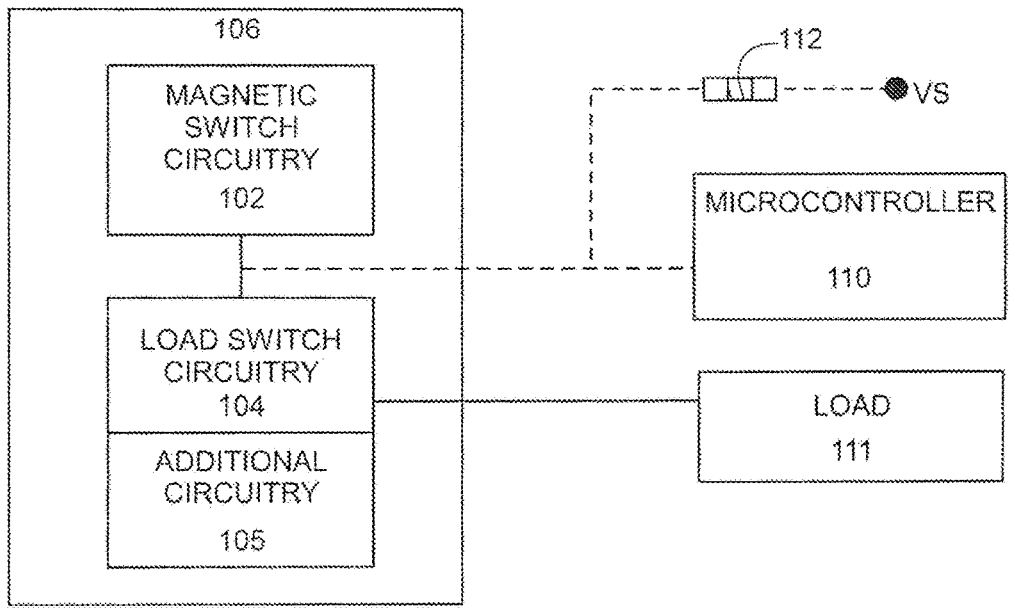
FIG. 1B is a block diagram of an integrated magnetic sensor switch device according to an embodiment.
Figure 2:
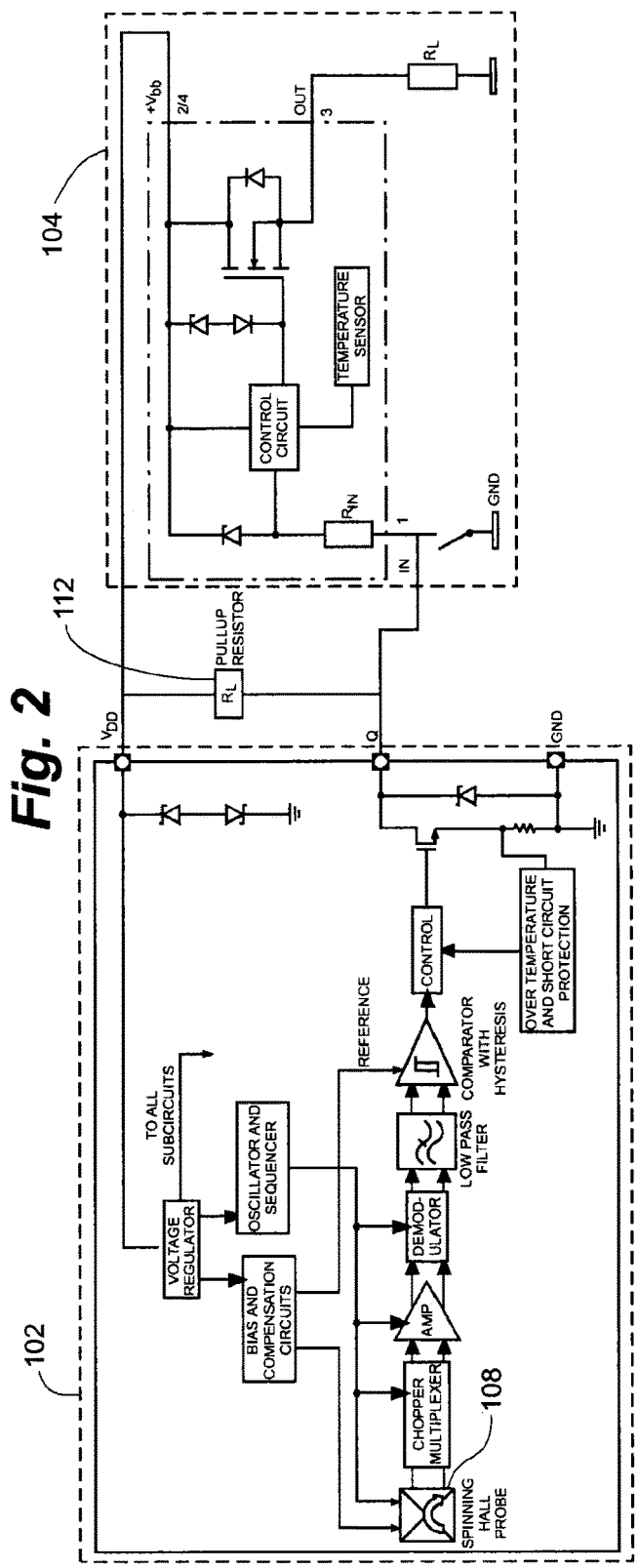
FIG. 2 is a circuit block diagram of an integrated magnetic sensor switch device according to an embodiment.

Referring to FIGS. 1A, 1B, and 2, a block diagram of a magnetic field sensor-controlled switch device 100 according to an embodiment is depicted. Device 100 comprises magnetic switch circuitry 102 and load switch circuitry 104 integrated in a single package 106 in an embodiment. In the embodiment of FIG. 1B, device 100 also comprises additional circuitry 105, which in embodiment can comprise at least one of additional load circuitry, integrated load protection circuitry or integrated load diagnostics disposed in package 106.

Magnetic switch circuitry 102 can comprise a Hall-effect sensor, a magnetoresistive (xMR) sensor, a magnetodiode, a magnetotransistor, a magnetic field-sensitive MOSFET (MAGFET) or some other suitable magnetic field or other sensor device in various embodiments. In embodiments, the sensor can further comprise a differential or gradiometric sensor device having multiple sensing elements, which can be more robust against interference magnetic fields. In the embodiment of FIG. 2, magnetic switch circuitry 102 comprises at least one Hall-effect sensor element 108, such as a Hall plate or a vertical Hall device, configured to detect a position of a magnet. In embodiments, magnetic switch circuitry 102 is configured to act as a switch and to provide switch logic level information to an external microcontroller 110, though this latter feature can be omitted in other embodiments.

Load switch circuitry 104, in embodiments, comprises a transistor, such as a field effect transistor (FET), linear current control circuitry, an active power switch such as a high-side power switch, an nMOS device, a pMOS device, a linear current source, a switched current source or some other suitable device configured to switch or other control a load 111. For example, load switch circuitry 104 can comprise a power FET in one embodiment. While device 100 is depicted comprising a single load switch circuitry 104 block, other embodiments can comprise a plurality of load switch circuitry 104 blocks, which can be desired in some applications.

In embodiments, switch 100 also comprises a pull-up resistor 112. As depicted in FIGS. 1A and 1B, pull-up resistor 112 is external to package 106. In other embodiments, pull-up resistor 112 is integrated with magnetic switch circuitry 102 and load switch circuitry 104 in package 106.

Magnetic switch circuitry 102 and load switch circuitry 104 can be configured within package 106 in various ways. For example, embodiments can comprise single-, dual- or multi-die configurations, including chip-on-chip, chip-by-chip and other suitable arrangements. For example, it can be desired in some embodiments for circuitries 102 and 104 to comprise different technologies, such as power technologies with thicker metal layers, particular features (e.g., DMOS or VMOS) and/or non-silicon technologies (e.g., GaN, silicon carbide or GaAs) for load switch circuitry 104 and CMOS, such as for Hall or xMR sensors. In these and other embodiments, logic, EEPROM and other circuitry can be implemented on a die with magnetic switch circuitry 102, where more functions can be implemented on a smaller die size and in less expensive technology, to reduce cost, though this is exemplary of only some embodiments and can vary in others. Separate dies, split, specially shaped and/or non-magnetic leadframes and other configurations and arrangements within package 106 can also be used in particular embodiments to improve desired thermal characteristics, such as thermal resistance, temperature crosstalk, thermal coupling and thermal isolation, and/or electromagnetic compatibility (EMC), among others.

Figure 3A:
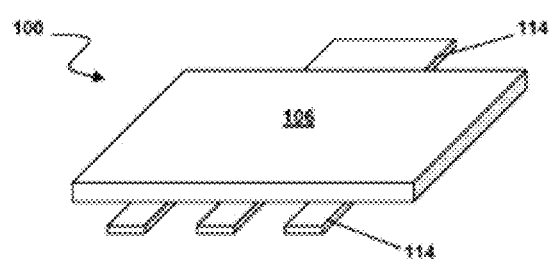
FIG. 3A is a diagram of a magnetic switch device package according to an embodiment.
Figure 3B:
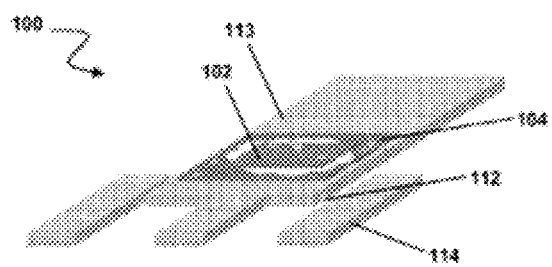
FIG. 3B is a diagram of the magnetic switch device of FIG. 3A without the package according to an embodiment.

Referring to FIGS. 3A and 3B, device 100 can comprise a chip-on-chip configuration of magnetic switch circuitry 102 and load switch circuitry 104 on a leadframe 113, with an internal pull-up resistor 112 within package 106. The relative chip-on-chip arrangement of circuitries 102 and 104 can vary in other embodiments. Switch 100 can alternatively comprise an external pull-up resistor 112. In one embodiment, device 100 is formed on a single semiconductor die, while in other embodiments a plurality of dies are used.

Figure 4A:
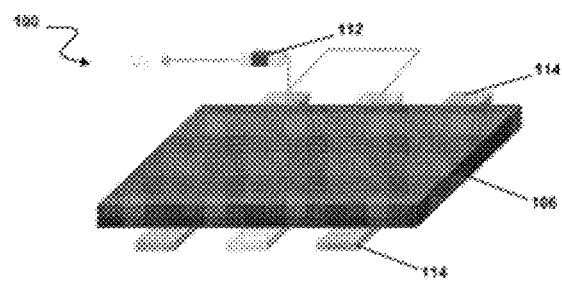
FIG. 4A is a diagram of a magnetic switch device package according to an embodiment.
Figure 4B:
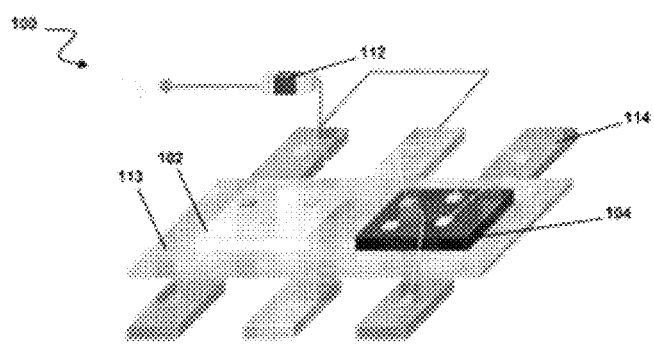
FIG. 4B is a diagram of the magnetic switch device of FIG. 4A without the package according to an embodiment.

Referring to FIGS. 4A and 4B, device 100 can comprise a chip-by-chip configuration of Hall switch circuitry 102 and load switch circuitry 104 on leadframe 113, with an internal or external pull-up resistor 112 (depicted as external in FIGS. 4A and 4B).

Figure 5:
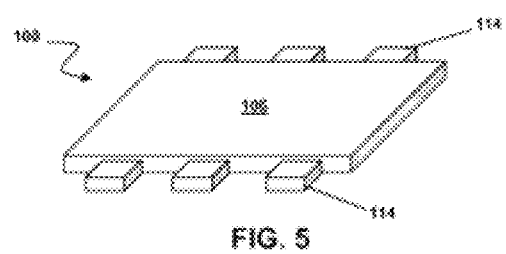
FIG. 5 is a diagram of a magnetic switch device package according to an embodiment.

In FIG. 5, one of magnetic switch circuitry 102 and load switch circuitry 104 (not visible) can be mounted on top of the leadframe while the other is mounted on the bottom. In can be advantageous, for example, to mount magnetic switch circuitry 102 on top of the leadframe such that it can be positioned closer to the magnet to minimize the air gap, with load switch circuitry on the bottom to dissipate more heat to the board.

Different coupling arrangements of magnetic switch circuitry 102 and load switch circuitry 104 can also be implemented in other embodiments. In one embodiment, load switch circuitry 104 can be coupled electrically in series with a current rail of magnetic switch circuitry 102. Such a configuration can be used to monitor the current and switch it off if it becomes too large or exhibits some other undesirable feature. In another embodiment, a single terminal of the load switch circuitry 104 can be coupled with the current rail of magnetic switch circuitry 102. Such a configuration can be more versatile by providing end users with the option of connecting the current rail and load switch circuitry 104 in series, parallel or some other desired configuration. In some embodiments, the current rail of magnetic switch circuitry 102 can be used as the die paddle for load switch circuitry 104, such that the die of load switch circuitry 104 is mounted onto the current rail. Such a configuration can provide a lower electrical resistance and thermal resistance of load switch circuitry 104. These embodiments are examples, and other embodiments can comprise these and/or other configurations.

Figures 6A, 6B:
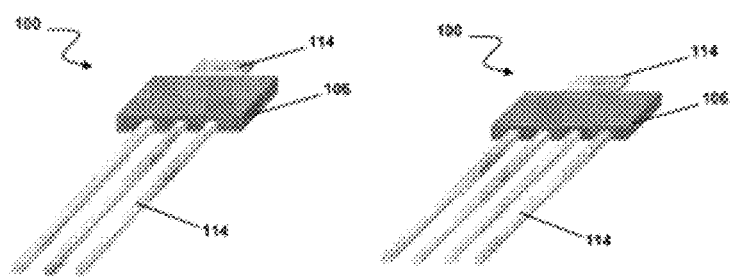
FIG. 6A is a diagram of a magnetic switch device package according to an embodiment.
FIG. 6B is a diagram of a magnetic switch device package according to an embodiment.
Figure 7:
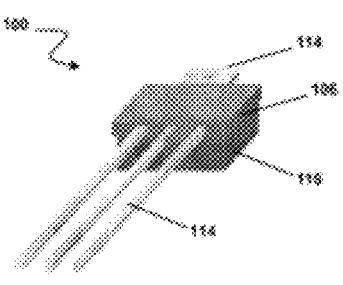
FIG. 7 is a diagram of a magnetic switch device package according to an embodiment.

The configuration of package 106 and leads 114, including the wirebonds as depicted, which can comprise other coupling types and configurations, can also vary in embodiments and/or applications, as appreciated by those skilled in the art. For example, some applications can require a particular external pull-up resistor, while others can select a particular configuration according to price sensitivity or some other characteristic. Device 100 can comprise virtually surface-mount device (SMD) in embodiments, with a variety of package and lead configurations and types. For example, FIGS. 6A and 6B depict three- and four-pin lead embodiments. Embodiments having extended lead lengths can be advantageous in embodiments in applications in which it is desired or required to have flexibility in the positioning of device 100. Longer leads provide more options for positioning, such as in remote locations, or the leads can be trimmed for more proximate locations. In another example, FIG. 7 depicts an integrated back bias (IBB) embodiment of device 100 and package 106, in which a magnet 116 is coupled in, on or to package 106.

In operation, a single integrated device 100 can signal load and logic in parallel. A load can be switched by load switching circuitry 104 by recognizing, by magnetic switch circuitry 102, the transgression of a magnetic field strength while, optionally, sending a logic signal to microcontroller 110 to indicate the change in state. Thus, the load can be driven and switched locally and directly by a single device, as opposed to conventional solutions in which a first device provides a logic signal to the microcontroller, which in turn signals a second device to switch a load.

Figure 8A:
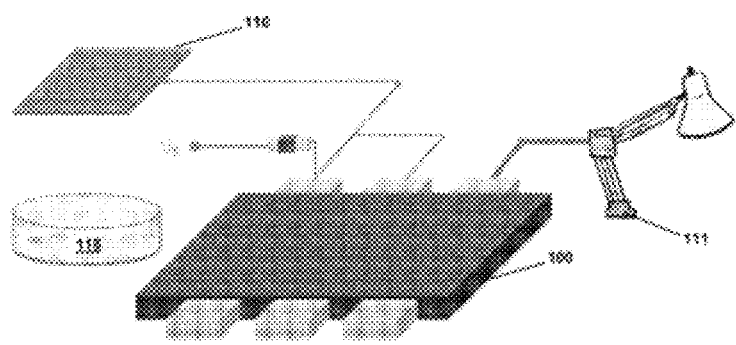
FIG. 8A is a diagram of an example implementation of a magnetic switch device according to an embodiment.
Figure 8B:
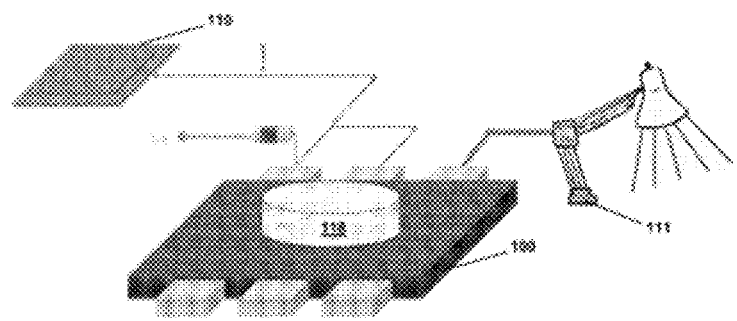
FIG. 8B is a diagram of an example implementation of a magnetic switch device according to an embodiment.

Referring to the example of FIGS. 8A and 8B, device 100 is coupled to a microcontroller 110 and a load 111. A varying magnetic field is represented by a magnet 118. In FIG. 8A, load 111 is switched off by device 100, whereas in FIG. 8B the change in magnetic field when magnet 118 shifts is sensed by magnetic switch circuitry 102 (not visible) such that, in parallel, the state of load 111 is switched, and microcontroller 110 is informed. In other embodiments, the switching can operate in the opposite manner or some other way, with FIGS. 8A and 8B being used to illustrate but one simplified example.

Figure 9A:
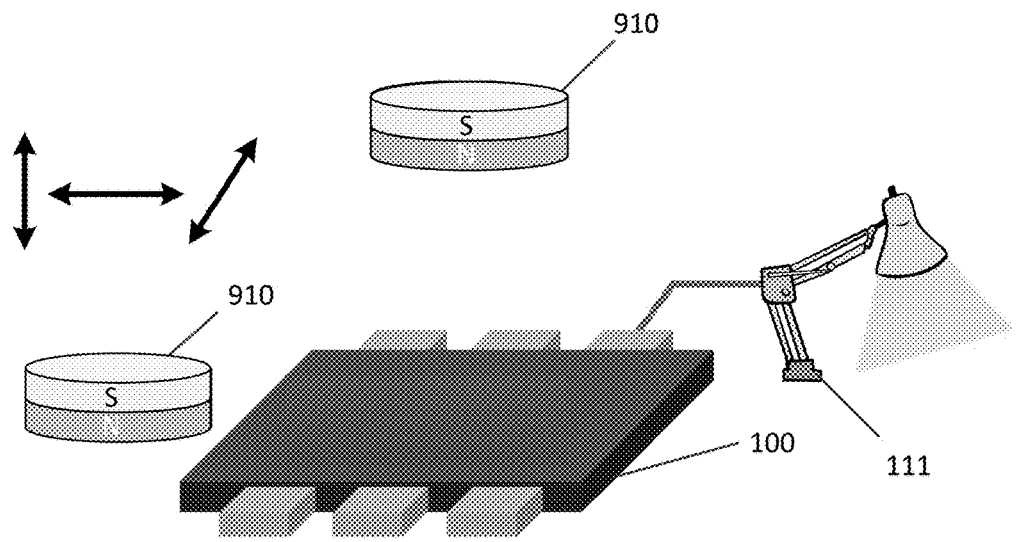
FIG. 9A is a diagram of an example implementation of a magnetic switch device according to an embodiment.

Referring to the example of FIG. 9A, device 100 is coupled to a load 111. The device 100 comprises the magnetic switch circuitry 102 and load switch circuitry 104 as discussed above. A unipolar magnet 910 has a north pole on one flat surface of the magnet and a south pole on the opposite flat surface. Only one pole, either north or south, faces the device 100, while the opposite pole faces away.

The magnetic switch circuitry 102 is configured to sense a dynamic change in a magnetic field caused by movement of the magnet 910 in a linear or three-dimensional direction. The magnetic switch circuitry 102 outputs a signal related to the sensed dynamic change in the magnetic field. This signal may be, for example, a digital or analog logic signal.

The load switch circuitry 104 is configured to control a variation of its output current and/or voltage according to the signal from the magnetic switch circuitry 102 to change a state of the load 111 in a range that may be anywhere between no load and full load. There is thus a dynamically changing control of the load 111 provided by sensing movement of the unipolar magnet 910 in any of the x, y, and z-directions, with a different function generated for each axis.

The device 100 combines the functions of detecting linear or three-dimensional movement of the unipolar magnet 910 and driving the load 111. Additionally and optionally, the output of the magnetic switch circuitry 102 may be fed simultaneously to update the microcontroller 110 (not visible) or an electronic control unit (ECU).

The example of switch 100 of FIG. 9A has many applications, including changing a lighting intensity, a lighting wavelength (i.e., color), a local distribution of light sources, or any combination thereof. Additional applications include controlling electric motor speeds/torque and changing a sensor signal of any type.

Figure 9B:
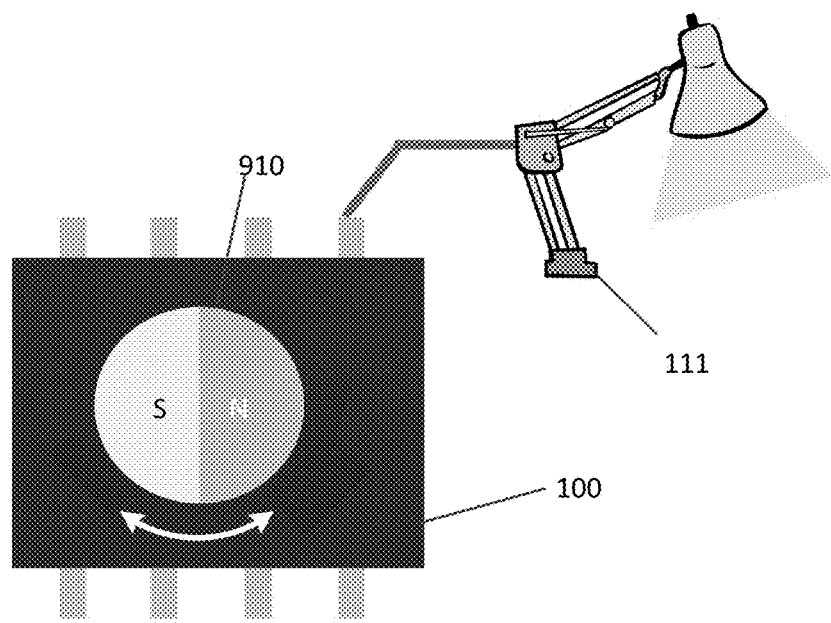
FIG. 9B is a diagram of an example implementation of a magnetic switch device according to an embodiment.

Referring to the example of FIG. 9B, device 100 is still coupled to a load 111. This example differs from that of FIG. 9A in that rather than a unipolar magnet, there is a bipolar magnet 920 which has both the north and south poles facing the device 100 at the same time.

The magnetic switch circuitry 102 is configured to sense a dynamic change in a magnetic field caused by movement of the magnet 920 in a rotational direction up to 360°. The magnetic switch circuitry 102 outputs a signal related to the sensed dynamic change in the magnetic field. This signal may be, for example, a digital or analog logic signal.

The load switch circuitry 104 is configured to control a variation of its output current and/or voltage according to the signal from the magnetic switch circuitry 102 to change a state of the load 111 in a range that may be anywhere between no load and full load. There is thus a dynamically changing control of the load 111 provided by sensing movement of the bipolar magnet 920 in the rotational direction.

The device 100 combines the functions of detecting rotational movement of the bipolar magnet 920 and driving the load 111. Additionally and optionally, the output of the magnetic switch circuitry 102 may be fed simultaneously to update the microcontroller 110 (not visible) or an electronic control unit (ECU). Switch 100 of the example of FIG. 9B has similar applications as that of the example of FIG. 9A. In general, the switch 100 of this disclosure has many applications, including lighting, domestic appliance, lifestyle and automotive, among others. Specific, though non-limiting, examples include cosmetics mirrors, drawer and cupboard lighting, automotive and vehicular brake lights, and refrigerator/freezers.

Switch 100 comprising a low-power magnetic switch can also be used for autonomous power saving lighting applications. Additionally, embodiments can be used as LED drivers, linear current sources or switching current regulators, such as for integrated magnetic LED switches. In some embodiments, loads can be about 100 mA to about 50 A or more, for example about 100 mA to about 5 A, or about 1 A to about 20 A, or some other range, with voltages of about 1 V to about 35 V or more, though these ranges can vary in other embodiments.

Embodiments provide many advantages. Cost savings can be realized with respect to conventional solutions because only a single package is necessary. The single package also requires less space, less wiring and fewer peripheries. For example, low-cost construction can include a solid-state relay mounting. With respect to functionality, the load is switched directly by the switch, rather than by a microcontroller, which becomes optional. In embodiments having a microcontroller, the microcontroller is always updated, and lifetime advantages can be realized in view of the robustness, reliability and durability of Hall switches as opposed to conventional mechanical solutions. Embodiments also provide improved controllability of switching activities.

Various embodiments of systems, devices and methods have been described herein. These embodiments are given only by way of example and are not intended to limit the scope of the disclosure. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the disclosure.

Persons of ordinary skill in the relevant arts will recognize that the disclosure may comprise fewer features than illustrated in any individual embodiment described above. The embodiments described herein are not meant to be an exhaustive presentation of the ways in which the various features of the disclosure may be combined. Accordingly, the embodiments are not mutually exclusive combinations of features; rather, the disclosure may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present disclosure, it is expressly intended that the provisions of Section 112(f) of 35 U.S.C. are not to be invoked unless the specific terms "means for" or "step for" are recited in a claim.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

The invention claimed is:

1. A magnetic field sensor-controlled switch device, comprising:
   magnetic switch circuitry comprising a magnetic sensor configured to sense a dynamic change in a magnetic field caused by movement of a magnet in at least one of a linear, three-dimensional, and rotational directions;
   a power transistor coupled to the magnetic switch circuitry, and configured to drive an external load; and
   an integrated circuit package comprising the magnetic switch circuitry and the power transistor, and an output to couple the integrated circuit package to the external load,
   wherein the magnetic switch circuitry is configured to send in parallel a logic signal to an external microcontroller and a load-control signal to the power transistor, in response to the dynamic change in the magnetic field.

2. The magnetic field sensor-controlled switch device of claim 1, wherein the magnet is a unipolar magnet, and the magnetic sensor is configured to sense the dynamic change in the magnetic field caused by the movement of the unipolar magnet in at least one of the linear and three-dimensional directions.

3. The magnetic field sensor-controlled switch device of claim 1, wherein the magnet is a bipolar magnet, and the magnetic sensor is configured to sense the dynamic change in the magnetic field cause by the movement of the bipolar magnet in the rotational direction.

4. The magnetic field sensor-controlled switch device of claim 1, wherein the external load comprises a light.

5. The magnetic field sensor-controlled switch device of claim 4, wherein the power transistor is configured to control an intensity of the light.

6. The magnetic field sensor-controlled switch device of claim 4, wherein the power transistor is configured to control a wavelength of the light.

7. The magnetic field sensor-controlled switch device of claim 4, wherein the external load comprises a plurality of lights, and the power transistor is configured to control a distribution of the plurality of lights.

8. The magnetic field sensor-controlled switch device of claim 1, wherein the external load comprises an electric motor.

9. The magnetic field sensor-controlled switch device of claim 8, wherein the power transistor is configured to control at least one of a speed and torque of the electric motor.

10. The magnetic field sensor-controlled switch device of claim 1, further comprising a pull-up resistor coupled to the magnetic switch circuitry and the power transistor and housed in the integrated circuit package.

11. The magnetic field sensor-controlled switch device of claim 1, wherein the magnetic sensor comprises a magnetic field sensor element selected from the group of magnetic field sensor elements consisting of a Hall-effect element, a magnetoresistive sensor element, a differential sensor element, a magnetodiode element, a magnetotransistor element, and a magnetic field-sensitive MOSFET element.

12. The magnetic field sensor-controlled switch device of claim 1, further comprising:

a die, wherein the magnetic switch circuitry and the power transistor are formed on the die.

* * * * *